US009296607B2

(12) United States Patent
Minervini

(10) Patent No.: US 9,296,607 B2
(45) Date of Patent: Mar. 29, 2016

(54) APPARATUS AND METHOD FOR REDUCED STRAIN ON MEMS DEVICES

(71) Applicant: INVENSENSE, INC., San Jose, CA (US)

(72) Inventor: Anthony D. Minervini, Palos Hills, IL (US)

(73) Assignee: INVENSENSE, INC., San Jose, CA (US)

( * ) Notice: Subject to any disclaimer, the term of this patent is extended or adjusted under 35 U.S.C. 154(b) by 0 days.

(21) Appl. No.: 14/244,255

(22) Filed: Apr. 3, 2014

(65) Prior Publication Data

US 2015/0021718 A1 Jan. 22, 2015

Related U.S. Application Data

(60) Provisional application No. 61/857,176, filed on Jul. 22, 2013.

(51) Int. Cl.
*B81B 7/00* (2006.01)
*B81B 3/00* (2006.01)
*B81C 1/00* (2006.01)

(52) U.S. Cl.
CPC ............ *B81B 7/0048* (2013.01); *B81B 7/0016* (2013.01); *B81B 3/0078* (2013.01); *B81B 7/0077* (2013.01); *B81C 1/00626* (2013.01)

(58) Field of Classification Search
CPC .. B81B 7/0048; B81B 3/0018; B81B 7/0016; B81B 1/004; B81B 7/0077; B81C 1/00626
USPC .......................................................... 257/415
See application file for complete search history.

(56) References Cited

U.S. PATENT DOCUMENTS

| 7,166,910 | B2 | 1/2007 | Minervini | |
|---|---|---|---|---|
| 7,242,089 | B2 | 7/2007 | Minervini | |
| 7,246,524 | B1 * | 7/2007 | Kholwadwala | ........... B64C 3/46 73/715 |
| 7,381,589 | B2 | 6/2008 | Minervini | |
| 7,382,048 | B2 | 6/2008 | Minervini | |
| 7,412,763 | B2 | 8/2008 | Jiles et al. | |
| 7,434,305 | B2 | 10/2008 | Minervini | |
| 7,439,616 | B2 | 10/2008 | Minervini | |
| 7,501,703 | B2 | 3/2009 | Minervini | |
| 7,537,964 | B2 | 5/2009 | Minervini | |
| 7,633,156 | B2 | 12/2009 | Minervini | |
| 7,860,264 | B2 | 12/2010 | Jiles et al. | |
| 8,018,049 | B2 | 9/2011 | Minervini | |
| 8,121,331 | B2 | 2/2012 | Minervini | |
| 8,358,004 | B2 | 1/2013 | Minervini | |
| 8,450,817 | B2 | 5/2013 | Minervini | |
| 8,501,517 | B1 * | 8/2013 | Yow et al. | ........................ 438/51 |
| 8,624,388 | B2 * | 1/2014 | Sun | ................................ 257/712 |
| 8,742,559 | B2 * | 6/2014 | Takahashi | ..................... 257/678 |

(Continued)

FOREIGN PATENT DOCUMENTS

WO    WO 2013046705 A  *  4/2013

*Primary Examiner* — Nathan Ha
(74) *Attorney, Agent, or Firm* — Minisandram Law Firm; Raghunath S. Minisandram

(57) ABSTRACT

A method and apparatus for coupling a MEMS device to a substrate is disclosed. The method includes providing a substrate with a conductor disposed over the substrate, adhering the MEMS device to the substrate, wherein a first elastomer adheres the MEMS device to the substrate. The MEMS device is electrically connected to the conductor using a wire bond.

21 Claims, 8 Drawing Sheets

(56) References Cited

U.S. PATENT DOCUMENTS

| | | | |
|---|---|---|---|
| 8,809,974 B2* | 8/2014 | Lo et al. | 257/416 |
| 8,921,955 B1* | 12/2014 | Lee et al. | 257/416 |
| 8,946,742 B2* | 2/2015 | Yu et al. | 257/98 |
| 2007/0013052 A1* | 1/2007 | Zhe et al. | 257/704 |
| 2009/0218668 A1* | 9/2009 | Zhe et al. | 257/680 |
| 2011/0000318 A1* | 1/2011 | Bradley | G01L 1/18 73/862.68 |
| 2011/0180924 A1* | 7/2011 | Tian et al. | 257/704 |
| 2013/0199295 A1* | 8/2013 | Hoefer et al. | 73/526 |
| 2014/0210019 A1* | 7/2014 | Nasiri et al. | 257/415 |
| 2014/0238131 A1 | 8/2014 | Yoshiuchi et al. | |
| 2014/0260678 A1* | 9/2014 | Jentoft | G01L 5/16 73/862.046 |

\* cited by examiner

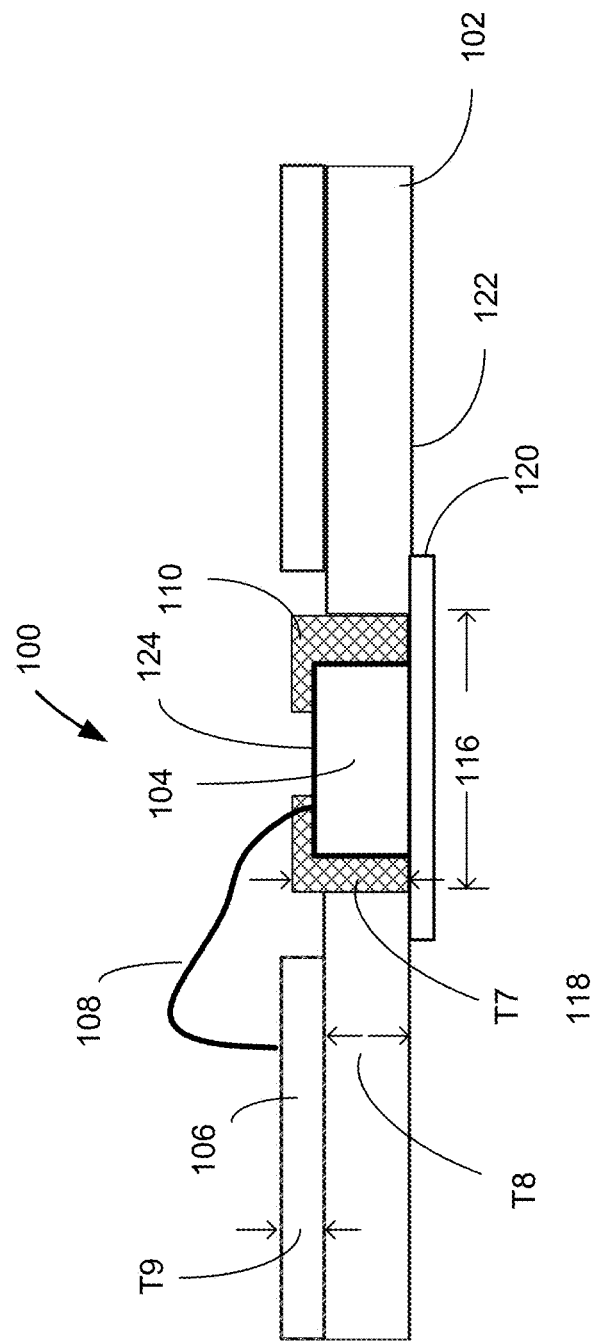

APPARATUS AND METHOD FOR REDUCED STRAIN ON MEMS DEVICES

RELATED APPLICATION

This application claims priority to U.S. provisional patent application 61/857176 filed on 22 Jul. 2013 entitled "Apparatuses and methods for minimized package induced strain on MEMS pressure sensors", which is incorporated herein by reference in its entirety.

TECHNICAL FIELD

The present invention relates generally to microelectromechanical systems (MEMS) device and more particularly, to packaging of MEMS devices with one or more sensors.

DESCRIPTION OF RELATED ART

MEMS devices are formed using various semiconductor manufacturing processes. MEMS devices may have fixed and movable portions. MEMS force sensors have one or more sense material, which react to an external influence imparting a force onto the movable portions. The sense material can be the MEMS structural layer or a deposited layer. The MEMS force sensor may be configured to measure these movements induced by the external influence to determine the type and extent of the external influence.

Sometimes, MEMS devices are packaged with other devices. For example, MEMS devices may be packaged with one or more electronic devices. These electronic devices may be disposed on a substrate. In some examples there may be a physical or mechanical connection between the MEMS device and the substrate on which other devices are disposed, in addition to electrical connection. As MEMS devices are configured to measure movements induced by the external influence, it is beneficial to minimize any undue external influences apart from the selective external influences the MEMS device is configured to measure. For example, substrates to which the MEMS device is physically coupled may induce or pass on undesirable stress to the MEMS device. These undesirable external influences may induce false measurements or introduce errors into the measurement capabilities of the MEMS device. It may be desirable to minimize effects of these undesirable external influences to the operational capabilities of the MEMS device.

With these needs in mind, the current disclosure arises. This brief summary has been provided so that the nature of the disclosure may be understood quickly. A more complete understanding of the disclosure can be obtained by reference to the following detailed description of the various embodiments thereof in connection with the attached drawings.

SUMMARY OF THE INVENTION

In one embodiment an apparatus is disclosed. The apparatus includes a substrate with a conductor disposed over the substrate. A MEMS device is adhered to the substrate, wherein a first elastomer adheres the MEMS device to the substrate. A wire bond electrically connects the MEMS device to the conductor.

In yet another embodiment, a method for coupling a MEMS device to a substrate is disclosed. The method includes providing a substrate with a conductor disposed over the substrate, adhering the MEMS device to the substrate, wherein a first elastomer adheres the MEMS device to the substrate. The MEMS device is electrically connected to the conductor using a wire bond.

This brief summary is provided so that the nature of the disclosure may be understood quickly. A more complete understanding of the disclosure can be obtained by reference to the following detailed description of the preferred embodiments thereof in connection with the attached drawings.

BRIEF DESCRIPTION OF THE DRAWINGS

The foregoing and other features of several embodiments are described with reference to the drawings. In the drawings, the same components have the same reference numerals. The illustrated embodiments are intended to illustrate but not limit the invention. The drawings include the following Figures:

FIG. 5A shows a MEMS device, adhered to a substrate, according to yet another aspect of the present disclosure ;

DETAILED DESCRIPTION

To facilitate an understanding of the adaptive aspects of the present disclosure, exemplary apparatus and method for reduced strain on MEMS device is described. The specific construction and operation of the adaptive aspects of the apparatus and method for reduced strain on MEMS device of the present disclosure are described with reference to an exemplary device with a substrate.

Figure 1:
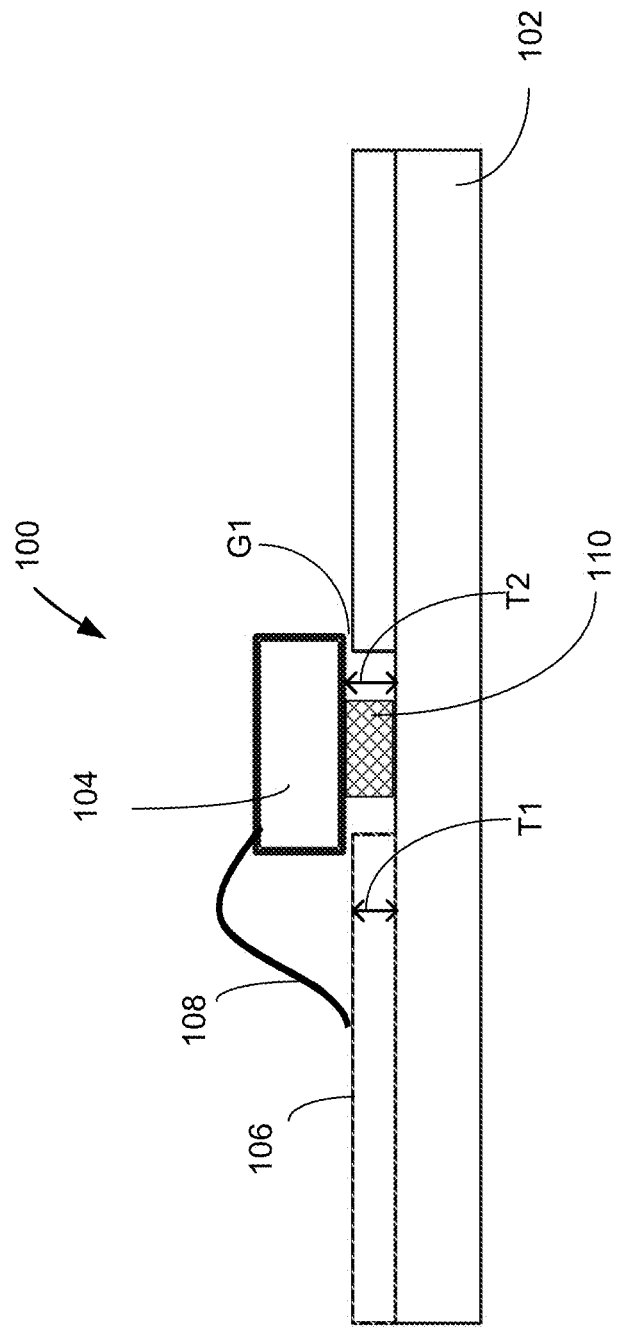
FIG. 1 shows a MEMS device, adhered to a substrate, according to one aspect of the present disclosure.

FIG. 1 shows a device 100, with a substrate 102 and a MEMS device 104. A conductor 106 is disposed over a surface of the substrate 102. A wire bond 108 electrically couples the MEMS device 104 to the conductor 106. One or more electronic circuits (not shown) may be disposed over the substrate and the conductor 106 may be configured to electrically couple the electronic circuit to the MEMS device.

In one example, a first elastomer 110 may be disposed over the substrate 102. In one example, the first elastomer 110 is configured to adhere to the substrate 102. The MEMS device is disposed over the first elastomer 110 so that the MEMS device adheres to the first elastomer 110. In some examples, the first elastomer 110 may have two or more phases. For example, an uncured phase and a cured phase. In uncured phase, the first elastomer 110 may be in a liquid state. However, in a cured phase, the first elastomer 110 may be in a solid state. As one skilled in the art appreciates, although the cured phase is referred to as a solid state, the young's modulus of the first elastomer 110 in a cured phase may be in the order of about 0.5 megapascal to about 5 megapascal. As a comparison, the young's modulus of the substrate 102 may be in the order of 10 gigapascal or more. In some examples, the first elastomer 110 may adhere to the substrate 102, once it turns to a cured phase. In one example, the first elastomer 110 is disposed over the substrate 102 in an uncured phase and then, the MEMS device 104 is disposed over the first elastomer 110. When the first elastomer 110 is cured, the first elastomer 110 adheres to the substrate 102 and the MEMS device 104. Once the first elastomer 110 is cured, the conductor 106 is coupled to the MEMS device 103 using the wire bond 108.

In some examples, a thickness T1 of the conductor 106 defines a bond thickness. In some examples, it may be preferable to have a thickness T2 of the first elastomer 110 to be greater than the thickness T1 of the conductor 106, when the first elastomer 110 is in a cured phase. For example, by having the thickness T2 of the first elastomer 110 greater than the bond thickness T1, the MEMS device 104 may be vertically separated from the substrate 102 by a gap G1. In some examples, the first elastomer 110 may shrink or collapse when the first elastomer 110 changes its state from an uncured phase to a cured phase. In some examples, the first elastomer 110 may expand when the first elastomer 110 changes its state from an uncured phase to a cured phase. As one skilled in the art appreciates, amount of first elastomer 110 disposed over the substrate 102 in an uncured phase may be suitably adjusted so that the thickness T2 of the first elastomer 110 in a cured phase is such that a desirable gap G1 is maintained between the MEMS device 104 and the substrate 102. Example dimensions for thickness T1 is about 8 um to about 37 um. Example dimension for thickness T2 is about 12 um to about 75 um. Example dimension for gap G1 is about 8 um to about 68 um.

Figure 2:
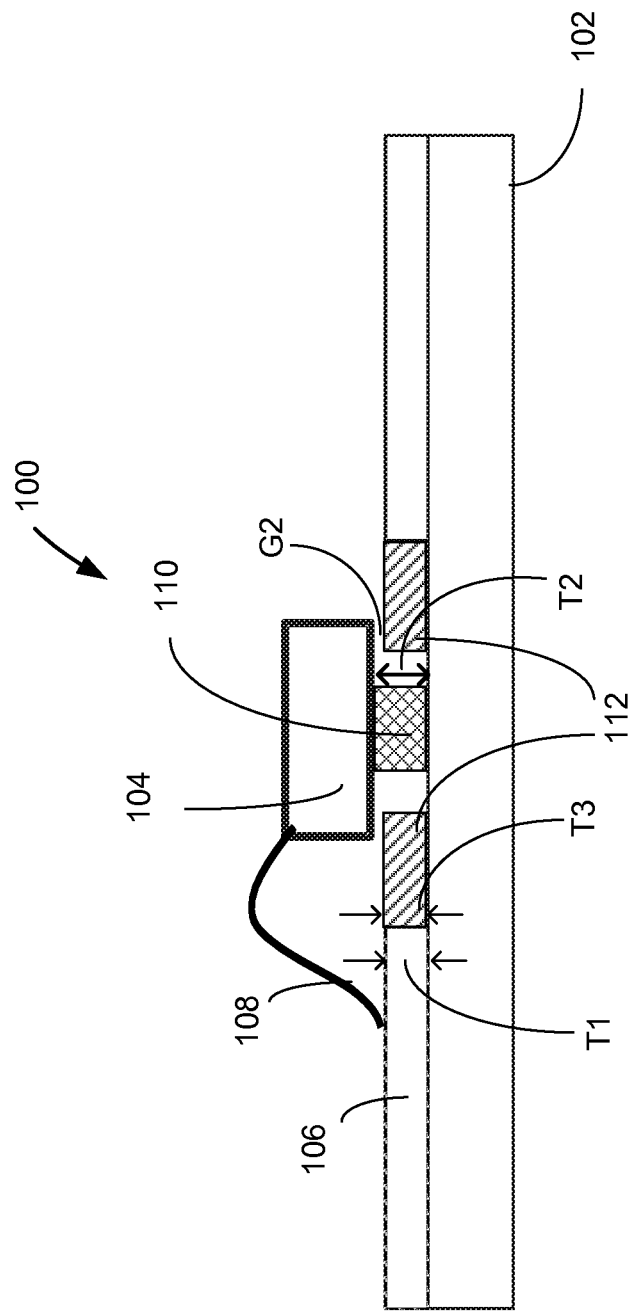
FIG. 2 shows a MEMS device, adhered to a substrate, according another aspect of the present disclosure.

FIG. 2 shows a device 100, with a substrate 102 and a MEMS device 104, according to another example. A conductor 106 is disposed over a surface of the substrate 102. A wire bond 108 electrically couples the MEMS device 104 to the conductor 106. One or more electronic circuits (not shown) may be disposed over the substrate and the conductor 106 may be configured to electrically couple the electronic circuit to the MEMS device.

In this example, a second elastomer 112 is disposed over the substrate 102. In some examples, the second elastomer 112 may be similar to first elastomer 110. For example, the second elastomer 112 may have an uncured phase and a cured phase. In uncured phase, the second elastomer 112 may be in a liquid state. However, in a cured phase, the second elastomer 112 may be in a solid state. As one skilled in the art appreciates, although the cured phase is referred to as a solid state, the young's modulus of the second elastomer 112 in a cured phase may be in the order of about 0.5 megapascal to about 5 megapascal. As a comparison, the young's modulus of the substrate 102 may be in the order of 10 gigapascal or more. In some examples, the second elastomer 112 may adhere to the substrate 102, once it turns to a cured phase. In one example, the second elastomer 112 is disposed over the substrate 102 in an uncured phase. After the second elastomer 112 reaches a cured phase, first elastomer 110 is disposed over the substrate 110 and the MEMS device 104 is disposed over the first elastomer 110. When the first elastomer 110 is cured, the first elastomer 110 adheres to the substrate 102 and the MEMS device 104. Once the first elastomer 110 is cured, the conductor 106 is coupled to the MEMS device 103 using the wire bond 108.

As one skilled in the art appreciates, in one example, a thickness T3 of the second elastomer 112 may be substantially equal to the bond thickness T1. In some examples, the thickness T3 of the second elastomer may be lower than the bond thickness T1. For example, by having the thickness T3 of the second elastomer 112 substantially equal to the bond thickness T1, the MEMS device 104 may temporarily rest on a top surface 114 of the second elastomer 112, for example, when the wire bond 108 is being coupled to the MEMS device 104. In some examples, the second elastomer 112 may act as a bumper, if the MEMS device is moved due to an external shock and the like. In some examples, the second elastomer 112 may shrink or collapse when the second elastomer 112 changes its state from an uncured phase to a cured phase. In some examples, the second elastomer 112 may expand when the second elastomer 112 changes its state from an uncured phase to a cured phase. As one skilled in the art appreciates, amount of second elastomer 112 disposed over the substrate 102 in an uncured phase may be suitably adjusted so that the thickness T2 of the first elastomer 110 in a cured phase is such that a desirable thickness T3 is maintained for the second elastomer 112.

In some examples, the thickness T2 of the first elastomer 110 may be such that MEMS device 104 may be vertically separated from the top surface 114 of the second elastomer 102 by a gap G2. In some examples, the first elastomer 110 may shrink or collapse when the first elastomer 110 changes its state from an uncured phase to a cured phase. In some examples, the first elastomer 110 may expand when the first elastomer 110 changes its state from an uncured phase to a cured phase. As one skilled in the art appreciates, amount of first elastomer 110 disposed over the substrate 102 in a liquid phase may be suitably adjusted so that the thickness T2 of the first elastomer 110 in a cured phase is such that a desirable gap G2 is maintained between the MEMS device 104 and the top surface 114 of the second elastomer 112. Example dimensions for thickness T1 is about 8 um to about 37 um. Example dimension for thickness T2 is about 12 um to about 75 um. Example dimension for thickness T3 is about 12 um to about 75 um. Example dimension for gap G2 is about ZERO to about 50 um.

Figure 3:
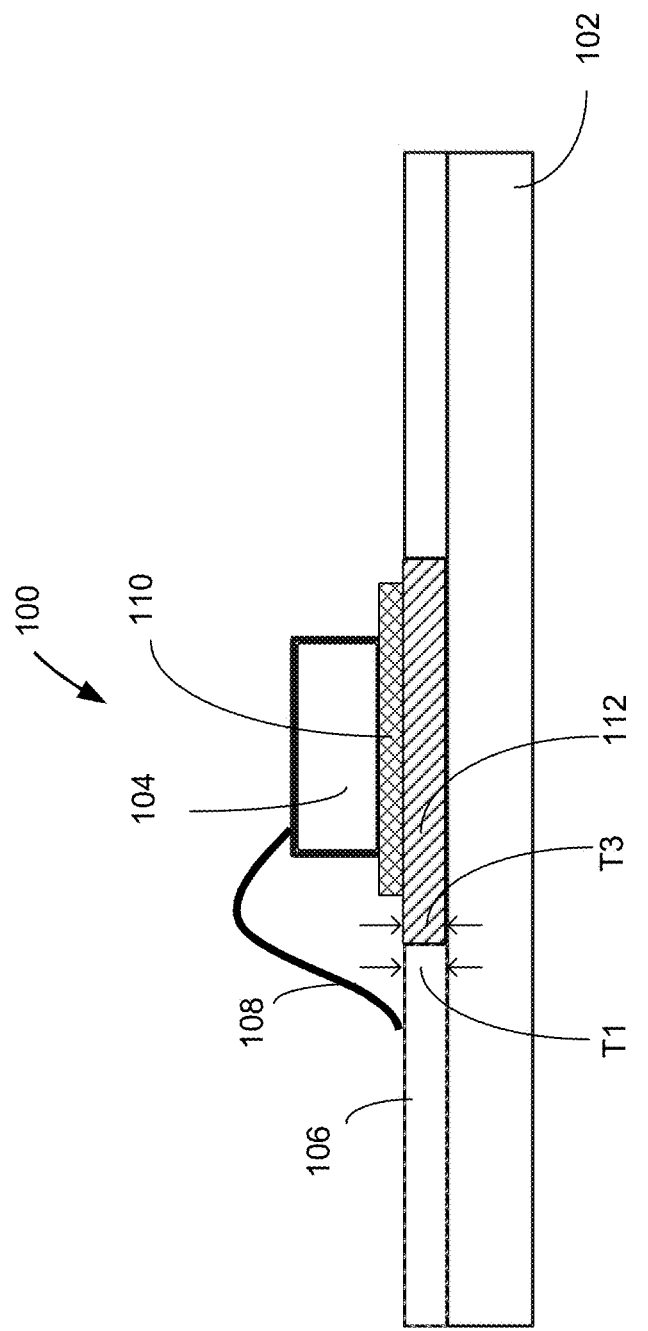
FIG. 3 shows a MEMS device, adhered to a substrate, according to yet another aspect of the present disclosure.

FIG. 3 shows a device 100, with a substrate 102 and a MEMS device 104, according to yet another example. In this example, the construction of the device 100 is similar to the construction of device 100 described with reference to FIG. 2 in that the device 100 of FIG. 3 includes a first elastomer 110 and second elastomer 112. However, in this example, the second elastomer 112 is first disposed over the substrate 102 and after the second elastomer 112 is in a cured phase, the first elastomer 110 is disposed over the second elastomer 112 in an uncured phase. Then, the MEMS device 104 is disposed over the first elastomer 110. When the first elastomer 110 reaches a cured phase, the first elastomer 110 adheres to the second elastomer 112 and the MEMS device 104. A wire bond 108 electrically couples the MEMS device 104 to the conductor 106. In one example, the wire bond 108 is electrically coupled after the first elastomer 110 is cured.

In this example, the thickness T3 of the second elastomer 112 is substantially equal to the bond line thickness T1, when the second elastomer 112 is in a cured phase.

Figure 4:
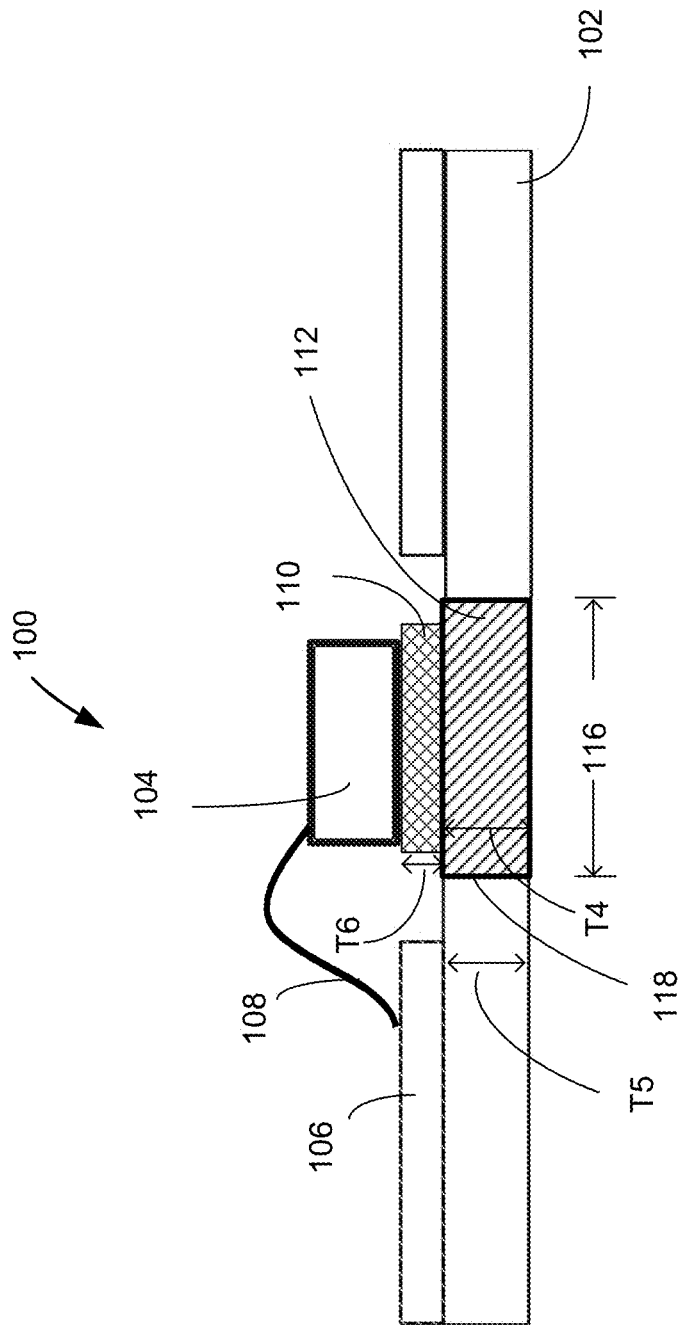
FIG. 4 shows a MEMS device, adhered to a substrate, according to yet another aspect of the present disclosure.

FIG. 4 shows a device 100, with a substrate 102 and a MEMS device 104, according to yet another example. In this example, the construction of the device 100 is similar to the construction of device 100 described with reference to FIG. 3 in that the device 100 of FIG. 3 includes a first elastomer 110 and second elastomer 112. However, in this example, the substrate 102 includes an aperture 116. The second elastomer 112 is first disposed in the aperture 116 of the substrate 102. For example, the second elastomer 112 adheres to inner wall 118 of the aperture 116 when in a cured phase. After the second elastomer 112 is in a cured phase, the first elastomer 110 is disposed over the second elastomer 112 in an uncured phase. Then, the MEMS device 104 is disposed over the first elastomer 110. When the first elastomer 110 reaches a cured phase, the first elastomer 110 adheres to the second elastomer 112 and the MEMS device 104. A wire bond 108 electrically couples the MEMS device 104 to the conductor 106. In one example, the wire bond 108 is electrically coupled after the first elastomer 110 is cured.

In this example, the thickness T4 of the second elastomer 112 is substantially equal to a thickness T5 of the substrate 102, when the second elastomer 112 is in a cured phase. Thickness T6 of the first elastomer 110 in a cured phase may be substantially equal to the bond line thickness T1. Example dimensions for thickness T1 is about 8 um to about 37 um. Example dimension for thickness T4 is about 75 um to about 250 um. Example dimension for thickness T5 is about 75 um to about 250 um. Example dimension for thickness T6 is about 8 um to about 37 um.

Figure 5:
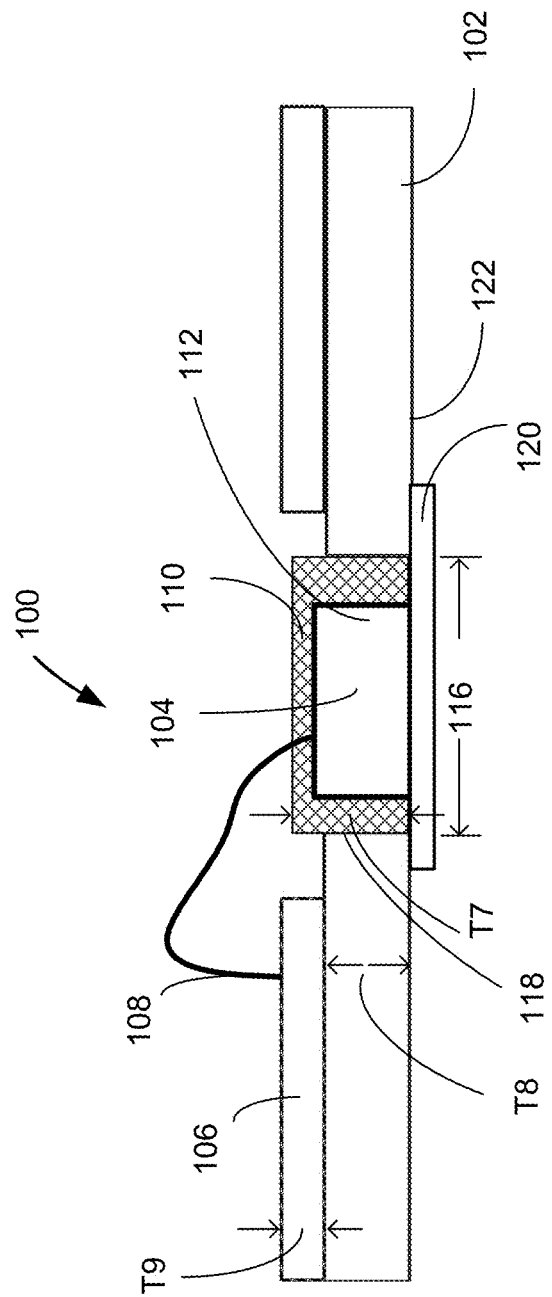
FIG. 5 shows a MEMS device, adhered to a substrate, according to yet another aspect of the present disclosure.

FIG. 5 shows a device 100, with a substrate 102 and a MEMS device 104, according to yet another example. In this example, the construction of the device 100 is similar to the construction of device 100 described with reference to FIG. 4 in that, in this example, the substrate 102 includes an aperture 116. In this example, the MEMS device 104 is disposed in the aperture 116. In some examples, a support structure 120 may be disposed on a bottom surface 122 of the substrate 102. The support structure 120 may partially or fully cover the aperture 116. For example, the MEMS device 104 may rest on the support structure 120 when the MEMS device 104 is disposed in the aperture 116. In one example, a wire bond 108 is electrically coupled to the MEMS device 104 and the conductor 106 after disposing the MEMS device 104 in the aperture. Then, the first elastomer 110 is disposed over the MEMS device 104 so that the first elastomer 110 adheres to the inner wall 118 of the aperture and portions of the MEMS device 104, when the first elastomer 110 reaches a cured phase. In some examples, support structure 120 may be removed after the first elastomer 110 reaches cured phase. A thickness T7 of the first elastomer 110 in cured phase may be such that it is less than or equal to a sum of the thickness T8 of the substrate 102 and thickness T9 of the bond line thickness.

Example dimension for thickness T7 is about 100 um to about 500 um. Example dimension for thickness T8 is about 50 um to about 250 um. Example dimension for thickness T9 is about 12 um to about 37 um.

In this example, the first elastomer 110 substantially encapsulates the MEMS device 104. In some examples, it may be desirable to have portions of the MEMS device exposed. An example device with such a construction is described with reference to FIG. 5A.

FIG. 5A shows a device 100, with a substrate 102 and a MEMS device 104, according to yet another example. In this example, the construction of the device 100 is similar to the construction of device 100 described with reference to FIG. 5 in that, in this example, the substrate 102 includes an aperture 116, the MEMS device 104 is disposed in the aperture 116, over a support structure 120. However, in this example, the first elastomer 110 partially encapsulates the MEMS device 104. A portion 124 of the MEMS device 104 is not covered by the first elastomer 110. In some examples, portion 124 of the MEMS device 104 may include one or more active elements that may have to be exposed, to perform one or more functions of the MEMS device 104. For example, if the MEMS device is a pressure sensor or a speaker or a microphone, portion 124 may contain corresponding active elements. In this example, thickness T7, T8 and T9 may similar to the thickness as described with reference to FIG. 5.

Figure 6:
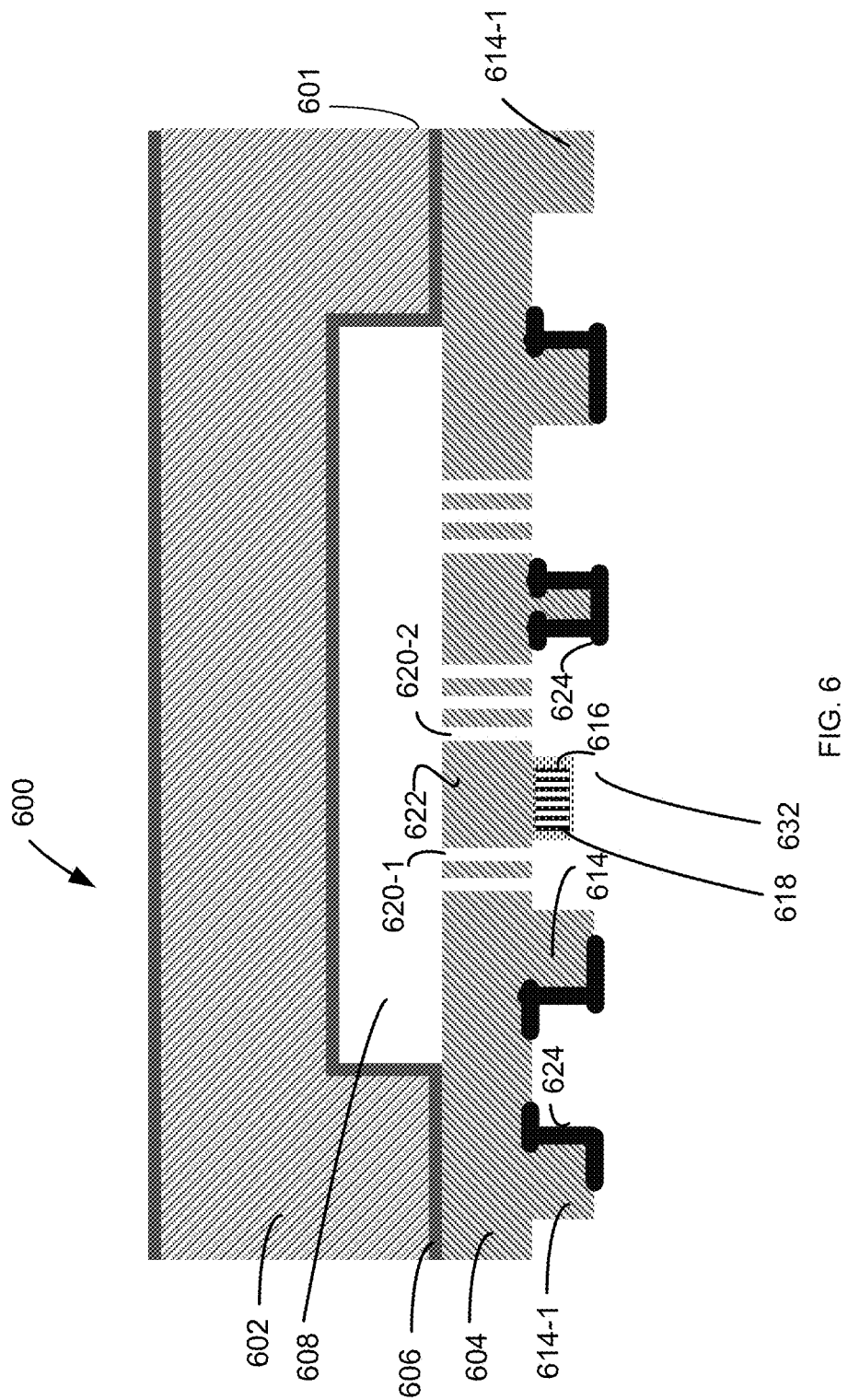
FIG. 6 shows an example MEMS device, according to one aspect of the present disclosure.

Now, referring to FIG. 6, an example MEMS device 600 is described. MEMS device 600 may be similar to MEMS device 104. MEMS substrate 601 includes a handle layer 602 and a device layer 604. One or more sensors are formed on the device layer 604. An example magnetic sensor will be described with reference to the MEMS device 600. Magnetic sensor may be configured as a compass. As one skilled in the art appreciates, additional sensors may be formed on the device layer, for example, an accelerometer, a gyroscope, a pressure sensor, a microphone and a speaker.

A fusion bond layer 606 bonds the handle layer 602 to device layer 604, to form an upper cavity 608, defined by the lower side 610 of the handle layer 602 and upper side 612 of the device layer 604. Now referring to device layer 604, a plurality of standoff 614 structures are formed on the device layer 604, for example, by deep reactive ion etching (DRIE) process. Magnetic films are deposited, patterned and magnetized on the lower side 615 of the device layer 604, to form a first permanent magnet 616. The first permanent magnet 616 is oriented in a predefined direction by applying an external magnetic field.

In some embodiments, a protective layer 618 is deposited over the first permanent magnet 616, to prevent oxidization of the first permanent magnet 616.

FIG. 6 also shows trench patterns 620-1 and 620-2, an actuator 622 and device pads 624. A movable actuator 622 is created by forming a plurality of trench patterns 620-1 and 620-2 on the device layer 604, for example, using a DRIE process. First permanent magnet 616 is located on the first actuator 622. Next, device pads 624, preferably made of germanium alloys are deposited and patterned on the device layer 604.

In one example, device pads 624 may be configured to be coupled to one or more conductors 106 disposed over substrate 102, using a wire bond 108 as previously described with reference to FIG. 1 through FIG. 5A. Wire bond 108 coupled to the device pads 624 provide a communication path to various sensors formed on the device layer 604. Standoff 614-1 surrounds various devices formed on the device layer 604. Height of the standoff 614-1, along with seal ring 630 define height of the lower cavity 632.

Figure 7:
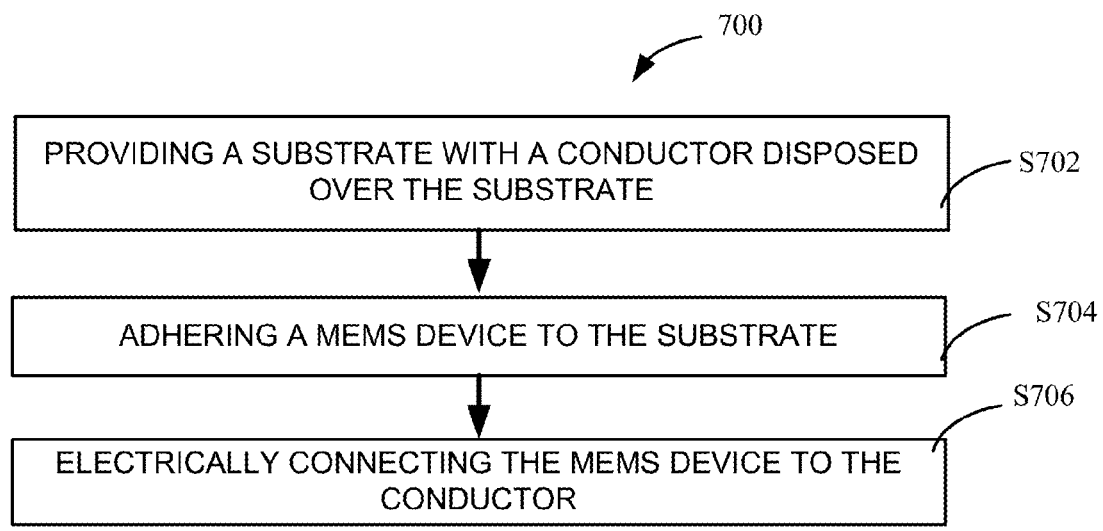
FIG. 7 shows a flow diagram to adhere a MEMS device to a substrate, according to one aspect of the present disclosure.

Now, referring to FIG. 7, an example flow diagram 700 will be described. In block S702, a substrate with a conductor disposed over the substrate is provided. For example, a substrate 102 with a conductor 106 disposed over the substrate 102 is provided.

In block S704, a MEMS device is adhered to the substrate. For example, MEMS device 104 is adhered to the substrate 102. In block S706, the MEMS device is electrically connected to the conductor. For example, a wire bond 108 may electrically connect the MEMS device to the conductor 106.

Now, one or more example methods of adhering the MEMS device to the substrate is described. As described with reference to FIG. 1, a first elastomer 110 is disposed over the substrate 102. The MEMS device 104 is disposed over the first elastomer 110. When the first elastomer cures, the first elastomer 110 adheres to the substrate 102 and MEMS device 104.

In another example, as described with reference to FIG. 2, a second elastomer 112 is disposed over the substrate 102. After the second elastomer 112 is cured, first elastomer 110 is disposed over the substrate 102. The MEMS device 104 is disposed over the first elastomer 110. When the first elastomer 110 cures, the first elastomer adheres to the substrate 102 and the MEMS device 104.

In yet another example, as described with reference to FIG. 3, a second elastomer 112 is disposed over the substrate. The second elastomer 112 adheres to the substrate 102 when cured. After the second elastomer 112 is cured, the first elastomer 110 is disposed over the second elastomer 112. The MEMS device 104 is disposed over the first elastomer 110.

The first elastomer 110 adheres to the MEMS device 104 and second elastomer 112, when cured.

In yet another example, as described with reference to FIG. 4, an aperture 116 is provided in the substrate 102. A second elastomer 112 is disposed in the aperture 116. The second elastomer 112 adheres to the inner wall 118 of the substrate 102, when cured. After the second elastomer 112 is cured, the first elastomer 110 is disposed over the second elastomer 112. The MEMS device 104 is disposed over the first elastomer 110. When the first elastomer 110 cures, the first elastomer 110 adheres to the second elastomer 112 and the MEMS device 104.

In yet another example, as described with reference to FIG. 5, an aperture 116 is provided in the substrate 102. In this example, the MEMS device 104 is disposed in the aperture 116. In some examples, a support structure 120 may be disposed on a bottom surface 122 of the substrate 102. The support structure 120 may partially or fully cover the aperture 116. For example, the MEMS device 104 may rest on the support structure 120 when the MEMS device 104 is disposed in the aperture 116. In one example, a wire bond 108 is electrically coupled to the MEMS device 104 and the conductor 106 after disposing the MEMS device 104 in the aperture. Then, the first elastomer 110 is disposed over the MEMS device 104 so that the first elastomer 110 adheres to the inner wall 118 of the aperture and portions of the MEMS device 104, when the first elastomer 110 reaches a cured phase. In some examples, support structure 120 may be removed after the first elastomer 110 reaches cured phase.

In yet another example, as described with reference to FIG. 5A, the substrate 102 includes an aperture 116. The MEMS device 104 is disposed in the aperture 116, over a support structure 120. Then, the first elastomer 110 is disposed over the MEMS device 104 so that the first elastomer 110 adheres to the inner wall 118 of the aperture and portions of the MEMS device 104, when the first elastomer 110 reaches a cured phase. However, in this example, the first elastomer 110 partially encapsulates the MEMS device 104. A portion 124 of the MEMS device 104 is not covered by the first elastomer 110. In some examples, portion 124 of the MEMS device 104 may include one or more active elements that may have to be exposed, to perform one or more functions of the MEMS device 104. For example, if the MEMS device is a pressure sensor or a speaker or a microphone, portion 124 may contain corresponding active elements.

In some examples, the substrate 102 may be a CMOS substrate, LGA substrate or any other suitable material for packaging an electronic device. In some examples, the first elastomer and second elastomer may be made of same materials. For example, commercially available silicone die attach adhesives may be used. Some example commercially available silicone die attach adhesives are SEMICOSIL® 988 or DOW® 7920. The benefit of using elastomers is at least twofold. First, they have a very low modulus which results in the elastomer absorbing most of the externally induced strain. This in turn results in the MEMS device experiencing little or approximately none of the externally induced strain. In addition to low modulus, elastomers are non linear materials. This attribute results in the elastomer absorbing the energy that may be inherent in vibratory (high frequency) strains. The elastomer essentially acts as a shock absorber in this situation thereby insulating the MEMS device from external vibrations (high frequency strains).

While embodiments of the present invention are described above with respect to what is currently considered its preferred embodiments, it is to be understood that the invention is not limited to that described above. To the contrary, the invention is intended to cover various modifications and equivalent arrangements within the spirit and scope of the appended claims.

What is claimed is:

1. A device, comprising:
a substrate with a conductor disposed over the substrate; and
a MEMS device adhered to the substrate, through a second elastomer,
wherein the second elastomer has an uncured phase and a cured phase and the MEMS device is disposed over the first elastomer after the second elastomer has switched from the uncured phase to the cured phase; and a first elastomer adheres the MEMS device to the substrate, wherein a wire bond electrically connects the MEMS device to the conductor.

2. The device of claim 1, wherein the second elastomer is adhered to the substrate and the MEMS device is configured to rest on the second elastomer.

3. The device of claim 1, wherein the first elastomer has an uncured phase and a cured phase and the MEMS device is disposed over the first elastomer when the first elastomer is in the uncured phase.

4. The device of claim 2, wherein a thickness of the conductor defines a bond line thickness and a thickness of the second elastomer is substantially equal to the bond line thickness.

5. The device of claim 1, wherein the first elastomer is configured to selectively yield so as to permit the MEMS device to selectively rest over a surface of the conductor.

6. The device of claim 1, wherein the first elastomer has an uncured phase and a cured phase and the MEMS device is disposed over the first elastomer before the first elastomer has switched to the cured phase, so as to adhere the MEMS device to the first elastomer when the first elastomer has switched to the cured phase.

7. The device of claim 1, wherein the substrate is provided with an aperture, the MEMS device is disposed in the aperture, the first elastomer disposed between the MEMS device and the substrate to adhere the MEMS device to the substrate.

8. The device of claim 7, wherein the first elastomer is disposed after the wire bond electrically connects the MEMS device to the conductor.

9. The device of claim 7, wherein the first elastomer substantially encapsulates the MEMS device.

10. The device of claim 1, wherein the second elastomer has a Young's Modulus of about 0.5 megapascal to about 5 megapascal in the cured phase.

11. The device of claim 3, wherein the first elastomer has a Young's Modulus of about 0.5 megapascal to about 5 megapascal in a cured phase.

12. The device of claim 6, wherein the first elastomer has a Young's Modulus of about 0.5 megapascal to about 5 megapascal in the cured phase.

13. A device, comprising:
a substrate with a conductor disposed over the substrate;
a MEMS device adhered to the substrate, wherein a first elastomer adheres the MEMS device to the substrate through a second elastomer,
wherein the second elastomer is disposed over the substrate, the second elastomer configured to adhere to the substrate,
wherein the first elastomer is disposed over the second elastomer, the first elastomer configured to adhere to the second elastomer; and
wherein the second elastomer has an uncured phase and a cured phase, and the first elastomer is disposed over the second elastomer, after the second elastomer has switched to the cured phase.

14. The device of claim 13, wherein the first elastomer has an uncured phase and a cured phase and the MEMS device is disposed over the first elastomer before the first elastomer has switched to the cured phase, so as to adhere the MEMS device to the first elastomer when the first elastomer has switched to the cured phase.

15. The device of claim 13, wherein a thickness of the conductor defines a bond line thickness and a thickness of the second elastomer is substantially equal to the bond line thickness.

16. The device of claim 13, wherein the substrate is provided with an aperture and the second elastomer is disposed in the aperture.

17. The device of claim 16, wherein the first elastomer has an uncured phase and a cured phase and the MEMS device is disposed over the first elastomer before the first elastomer has switched to the cured phase, so as to adhere the MEMS device to the first elastomer when the first elastomer has switched to the cured phase.

18. The device of claim 16, wherein a thickness of the substrate defines a substrate thickness and a thickness of the second elastomer is substantially equal to the substrate thickness.

19. The device of claim 13, wherein the second elastomer has a Young's Modulus of about 0.5 megapascal to about 5 megapascal in the cured phase.

20. The device of claim 14, wherein the first elastomer has a Young's Modulus of about 0.5 megapascal to about 5 megapascal in the cured phase.

21. The device of claim 17, wherein the first elastomer has a Young's Modulus of about 0.5 megapascal to about 5 megapascal in the cured phase.

* * * * *